United States Patent
Phan et al.

(10) Patent No.: US 6,367,042 B1
(45) Date of Patent: Apr. 2, 2002

(54) TESTING METHODOLOGY FOR EMBEDDED MEMORIES USING BUILT-IN SELF REPAIR AND IDENTIFICATION CIRCUITRY

(75) Inventors: Tuan L. Phan, San Jose; V. Swamy Irrinki, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/209,996

(22) Filed: Dec. 11, 1998

(51) Int. Cl.⁷ .............................................. G01R 31/28
(52) U.S. Cl. ...................................................... 714/733
(58) Field of Search ................................ 714/732–735, 714/7, 30; 365/200

(56) References Cited

U.S. PATENT DOCUMENTS

| | | | |
|---|---|---|---|
| 5,068,547 A | 11/1991 | Gascoyne | 307/443 |
| 5,155,432 A | 10/1992 | Mahoney | 324/763 |
| 5,249,281 A | 9/1993 | Fuccio et al. | 711/123 |
| 5,381,417 A | 1/1995 | Loopik et al. | 714/724 |
| 5,486,786 A | 1/1996 | Lee | 327/378 |
| 5,515,383 A | * 5/1996 | Katoozi | 714/732 |
| 5,524,114 A | 6/1996 | Peng | 714/724 |
| 5,535,164 A | 7/1996 | Adams et al. | 365/201 |
| 5,574,692 A | 11/1996 | Dierke | 365/201 |
| 5,577,050 A | 11/1996 | Bair et al. | 714/710 |
| 5,608,257 A | 3/1997 | Lee et al. | 257/529 |
| 5,633,599 A | 5/1997 | Kubota | 326/16 |

(List continued on next page.)

OTHER PUBLICATIONS

U.S. application No. 08/972,137, Schwarz et al., filed Nov. 17, 1997.
U.S. application No. 08/970,030, Irrinki, filed Nov. 13, 1997.
U.S. application No. 09/237,769, Phan, filed Jan. 26, 1999.
Tanabe et al., A 30–ns 64–DRAM with BIST and Self–Repair Function, IEEE, pp. 1525–1533, Nov. 1992.*
Stroud, An Automated BIST Approach for General Sequnetial logic Synthesis, IEEE, pp. 3–8, 1988.*

*Primary Examiner*—Albert DeCady
*Assistant Examiner*—Shelly A Chase
(74) *Attorney, Agent, or Firm*—Akin, Gump, Strauss, Hauer & Feld, LLP

(57) ABSTRACT

A method for improving the fault coverage of manufacturing tests for integrated circuits having structures such as embedded memories. In the disclosed embodiment of the invention, the integrated circuit die of a semiconductor wafer are provided with a fuse array or other circuitry capable of storing an identification number. The integrated circuit die also include an embedded memory or similar circuit and built-in self-test (BIST) and built-in self-test (BISR) circuitry. At a point early in the manufacturing test process, the fuse array of each integrated circuit die is encoded with an identification number to differentiate the die from other die of the wafer or wafer lot. The integrity of the embedded memory of each integrated circuit die is then tested at the wafer level under a variety of operating conditions via the BIST and BISR circuitry. The results of these tests are stored in ATE and associated with a particular integrated circuit die via the identification number of the die. The manufacturing test process then continues for the packaged integrated circuits. As with the unsingulated die, the packaged parts are subjected to one or more sets of stress factors, with data being gathered at each stage. Again, test results (e.g., faulty memory locations as determined by the BIST circuitry) are correlated to specific packaged parts via the identification number of the integrated circuit die. The test results of the various stages are next compared to determine if any detected repairable failures are uniform across the various operating conditions. In general, the assumption is made that an integrated circuit IC which exhibits different failure mechanisms at different stages of the testing/manufacturing process is questionable and the part is discarded.

20 Claims, 4 Drawing Sheets

U.S. PATENT DOCUMENTS

| | | |
|---|---|---|
| 5,646,948 A | 7/1997 | Kobayashi et al. .......... 714/719 |
| 5,663,967 A | 9/1997 | Lindberg et al. ............. 714/731 |
| 5,734,615 A | 3/1998 | Dierke ....................... 365/201 |
| 5,745,500 A * | 4/1998 | Damarla et al. ............. 714/732 |
| 5,761,489 A | 6/1998 | Broseghini et al. .......... 712/227 |
| 5,764,655 A * | 6/1998 | Kirihata et al. .............. 714/733 |
| 5,764,878 A * | 6/1998 | Kablanian et al. .............. 714/7 |
| 5,799,080 A * | 8/1998 | Padmanabhan et al. ......... 380/4 |
| 5,822,228 A | 10/1998 | Irrinki et al. ................ 714/710 |
| 5,917,764 A * | 6/1999 | Ohsawa et al. .............. 365/200 |
| 5,920,515 A * | 7/1999 | Shaik et al. ................. 365/200 |
| 6,067,262 A | 5/2000 | Irrinki et al. ................ 365/201 |

* cited by examiner

TESTING METHODOLOGY FOR EMBEDDED MEMORIES USING BUILT-IN SELF REPAIR AND IDENTIFICATION CIRCUITRY

BACKGROUND OF THE INVENTION

1. Field of the Invention

The present invention relates to testing of integrated circuits, and more particularly to a method for correlating test results of an integrated circuit die across various stages of the manufacturing process.

2. Description of the Related Art

Improvements in semiconductor processes are making possible integrated circuits of increasing size and complexity. The semiconductor processing technologies that produce these integrated circuits have advanced to the point where complete systems, including memories, can now be reduced to a single integrated circuit or application specific integrated circuit (ASIC) device. These integrated circuits (also referred to as "die" or "chips") may use many functions that previously could not be implemented on a single die. It is a common practice for the manufacturers of such integrated circuits to thoroughly test device functionality at the manufacturing site. However, due to the complex nature of today's integrated circuits and a concomitant sensitivity to variations in manufacturing processes, manufacturers are constantly confronted with new testing challenges.

Before manufacturers release integrated circuits for shipment, the devices typically undergo a variety of testing procedures. In ASIC devices incorporating integrated memories, for example, specific tests are performed to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects and degradation faults. Such manufacturing issues are likely to increase as process geometries continue to shrink and the density of memory cells increases. Even today, up to 100 Mbits or more of dynamic random access memory (DRAM), or several megabits of static random access memory (SRAM) or flash memory can be integrated onto a single integrated circuit.

A number of ASIC memory testing strategies have evolved, many of which involve use of an external memory tester or Automated Test Equipment (ATE). If memory is accessible from input/output (I/O) pins, either directly or by multiplexing, a hardware test mode can be utilized. In this mode, a production test system accesses the memory directly by writing to and reading from the memory bits. While this methodology does not use any chip area other than simple multiplexing circuitry, it is limited to on-chip memories and other circuitry accessible via I/O pins. Another drawback of this approach is that ATE capabilities are generally not available to end-users once the devices have been shipped, making it difficult to detect faults occurring after shipment.

If an embedded memory is buried deeply within an ASIC, built-in self-test (BIST) is often considered the most practical and efficient test methodology and is becoming increasing popular with semiconductor vendors. BIST allows timely testing of the memory with a reasonably high degree of fault coverage, without requiring complex external test equipment and large amounts of external access circuitry. One advantage BIST has over many traditional testing methods is that with BIST, memory or logic circuitry can be tested at any time in the field. This capability offers some degree of continued fault protection.

BIST refers in general to any test technique in which test vectors are generated internal to an integrated circuit or ASIC. Test vectors are sequences of signals that are applied to integrated circuitry to determine if the integrated circuitry is performing as designed. BIST can be used to test memories located anywhere on the ASIC without requiring dedicated I/O pins, and can be used to test memory or logic circuitry every time power is applied to the ASIC, thereby allowing an ASIC to be easily tested after it has been incorporated in an end product. A number of software tools exist for automatically generating BIST circuitry, including RAMBIST Builder by LSI Logic of Milpitas, Calif. Such software produces area-efficient BIST circuitry for testing memories, and reduces time-to-market and test development costs.

In the BIST approach, a test pattern generator and test response analyzer are incorporated directly into the device to be tested. BIST operation is controlled by supplying an external clock and via use of a simple commencement protocol. BIST test results are typically compressed—usually to the level of "passed" or "failed". At the end of a typical structured BIST test, or "run", a simple pass/fail signal is asserted, indicating whether the device passed or failed the test. Intermediate pass/fail signals may also be provided, allowing individual memory locations or group of locations to be analyzed. Unlike external testing approaches, at-speed testing with BIST is readily achieved. BIST also alleviates the need for long and convoluted test vectors and may function as a surrogate for functional testing or scan testing. Further, since the BIST structures exist and remain active throughout the life of the device, BIST can be employed at the board or system level to yield reduced system testing costs, and to reduce field diagnosis and repair costs.

In addition to the aforementioned testing procedures, manufacturers use a number of techniques to repair faulty memories when feasible. Such techniques include bypassing defective cells using laser procedures and fused links that cause address redirection. However, such techniques are limited to one-time repair and require significant capital investment. Further, these techniques may leave integrated circuits useless if the repaired memories become defective after shipment from the manufacturing site—even where test equipment is available to end users, traditional field repairs have been expensive, time consuming, and largely impracticable.

In order to enhance the repair process, on-chip built-in self repair (BISR) circuitry for repairing faulty memory cells has evolved. BISR circuitry functions internal to the integrated circuit without detailed interaction with external test or repair equipment. In the BISR approach, suitable test algorithms are preferably developed and implemented in BIST or BIST-like circuitry. These test patterns may be capable of detecting stuck-at, stuck-open, bridging faults and retention faults during memory tests. Following execution of the test patterns, the BISR circuitry analyzes the BIST "signature" (results) and, in the event of detected faults, automatically reconfigures the defective memory utilizing redundant memory elements to replace the defective ones. A memory incorporating BISR is therefore defect-tolerant. The assignee of the present invention, LSI Logic Corporation, has addressed different methods of repairing faulty memory locations utilizing BIST and BISR circuitry, as disclosed in U.S. Pat. No. 5,764,878, entitled "BUILT-IN SELF REPAIR SYSTEM FOR EMBEDDED MEMORIES", and U.S. patent application Ser. No. 08/970,030, now abandoned entitled "METHOD FOR SEPARATING PRIME AND REPAIRED INTEGRATED CIRCUITS INCORPORATING BUILT-IN SELF TEST AND BUILT-IN SELF REPAIR CIRCUITRY," both of which are hereby incorporated by reference as if set forth in their entirety.

BISR compliments BIST because it takes advantage of on-chip processing capabilities to re-route bad memory bits rather than using an expensive and slow laser burning process to replace faulty memory locations. Some BISR circuitry is capable of repairing the faulty memory locations by redirecting the original address locations of faulty memory lines to the mapped addressed locations of the redundant columns and rows. Options for repair include either row and column replacement when a faulty bit is found in a particular row or column.

During the testing process, it is often desirable to separate so-called "prime die" (integrated circuit die in which no redundant BISR memory components were utilized during initial testing) from "repaired die". Separating integrated circuit die in this manner provides an indication of quality and fault tolerance. Because the BIST and BISR circuitry of an integrated circuit continue to be functional in the field, any BISR redundancy resources not expended during initial testing are available to repair faults that may occur in the field. Consequently, prime die have a higher degree of fault tolerance, and can often be sold by manufacturers for a premium.

An important feature of any integrated circuit is its reliability. Engineers strive to design integrated circuits that operate under a range of conditions (including temperatures and voltages) without malfunctioning. Therefore, it is often desirable to test dies (or "dice") under realistic field conditions during the manufacturing production cycle to ensure operability. This testing is done before singulation (i.e., separation) of the individual dies from a wafer. Furthermore, instead of using costly external test patterns to test memory locations, it is desirable to use the BIST circuitry with external ATE. The external tester is programmed to "test" a die's embedded memory by examining the outputs of the its BIST circuitry. With stand alone memory devices, manufacturers use dedicated memory ATEs to test over a range of conditions. Typically, a worst set of operating conditions is applied and any detected faults, if possible, are repaired using fuse structures. This approach may not work for integrated circuits incorporating embedded memories and BIST/BISR capabilities, as test and repair routines are generally executed only at power-up.

Running current BIST algorithms may not adequately detect memory locations having faults that are dependent on operating conditions. Even with BIST/BISR, memory elements can pass power-up BIST under one set of conditions, only to fail during normal operation when the die is subsequently subjected to another set of conditions. Since BIST/BISR is typically run only once during a power cycle, any memory locations that fail after power-up may not be repaired. Such failures may cause the chip to be unsuitable for its intended use.

Prior test methods may fail to introduce realistic field conditions or stress factors (e.g., normal variation in voltage, timing, power supply disturbances and temperature) during these tests to insure adequate fault coverage. Consequently, suspect memory locations that pass under an initial set of operating conditions but fail under a subsequent set of operating conditions may not be identified by current production test programs. Further, since BISR structures have a limited number of redundant memory locations, a device may be repairable only under select operating conditions. The problem may be exacerbated by the rigors of the packaging process, which may give rise to failure mechanisms not present in a given integrated circuit before singulation.

Currently, no satisfactory method exists for correlating memory test results (such as BIST test results) across the various stages of the manufacturing and packaging processes for integrated circuits. Such test results may include, for example, wafer-level testing of the integrated circuit and test results from corresponding packaged devices.

SUMMARY OF THE INVENTION

Briefly, the present invention provides a method for improving the fault coverage of manufacturing tests for integrated circuits having structures such as embedded memories. An identification circuit is provided to allow for comparison of failure mechanisms at different stages of the manufacturing process.

In the disclosed embodiment of the invention, the integrated circuit die of a semiconductor wafer are provided with a fuse array or other circuitry capable of storing an identification number, an embedded memory or similar circuit, and BIST/BISR circuitry. At a point early in the manufacturing test process, the fuse array of each integrated circuit die is encoded with an identification number to differentiate the die from other die of the wafer or wafer lot. Preferably, the identification numbers are capable of being read by ATE. The integrity of the embedded memory of each integrated circuit die is then tested under a variety of conditions (also referred to as stress factors) via the BIST and BISR circuitry. The results of these tests are stored in ATE and associated with a particular integrated circuit die via the identification number of the die. At each manufacturing test step of a method according to the disclosed embodiment of the invention, the fuse identification numbers are read into the test database along with the BIST signature or memory repair solution to facilitate failure analysis. The test results for the pre-packed integrated circuit die can be compared for a variety of test conditions to determine if the functionality of the device is questionable and, if so, the device is discarded.

The integrated circuit die are next singulated and packaged. Under other test approaches, the identification of the integrated circuit die (e.g., the x-y coordinates of the individual die of the wafer) are lost following singulation. The fuse identification circuit of the present invention, however, allows prior test results to be correlated with test results of the packaged part.

Accordingly, the manufacturing test process then continues for the packaged integrated circuits. As with the unsingulated die, the packaged parts are subjected to one or more sets of stress factors, with data being gathered at each stage. Again, test results (e.g., faulty memory locations as determined by the BIST circuitry) are correlated to specific parts via the identification number of the integrated circuit die. The test results of the various stages are next compared to determine if any detected repairable failures are uniform across the various operating conditions. In general, the assumption is made that an integrated circuit IC that exhibits different failure mechanisms at different stages of the testing/manufacturing process is questionable and the part is discarded.

This novel methodology of redundancy analysis allows circuits with self-repair capabilities (such as embedded memories) to be tested at various stages of the manufacturing process using a standard logic tester and permits detection of likely field errors that are dependent on operating conditions, thereby improving fault coverage and increasing the quality of the end product.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
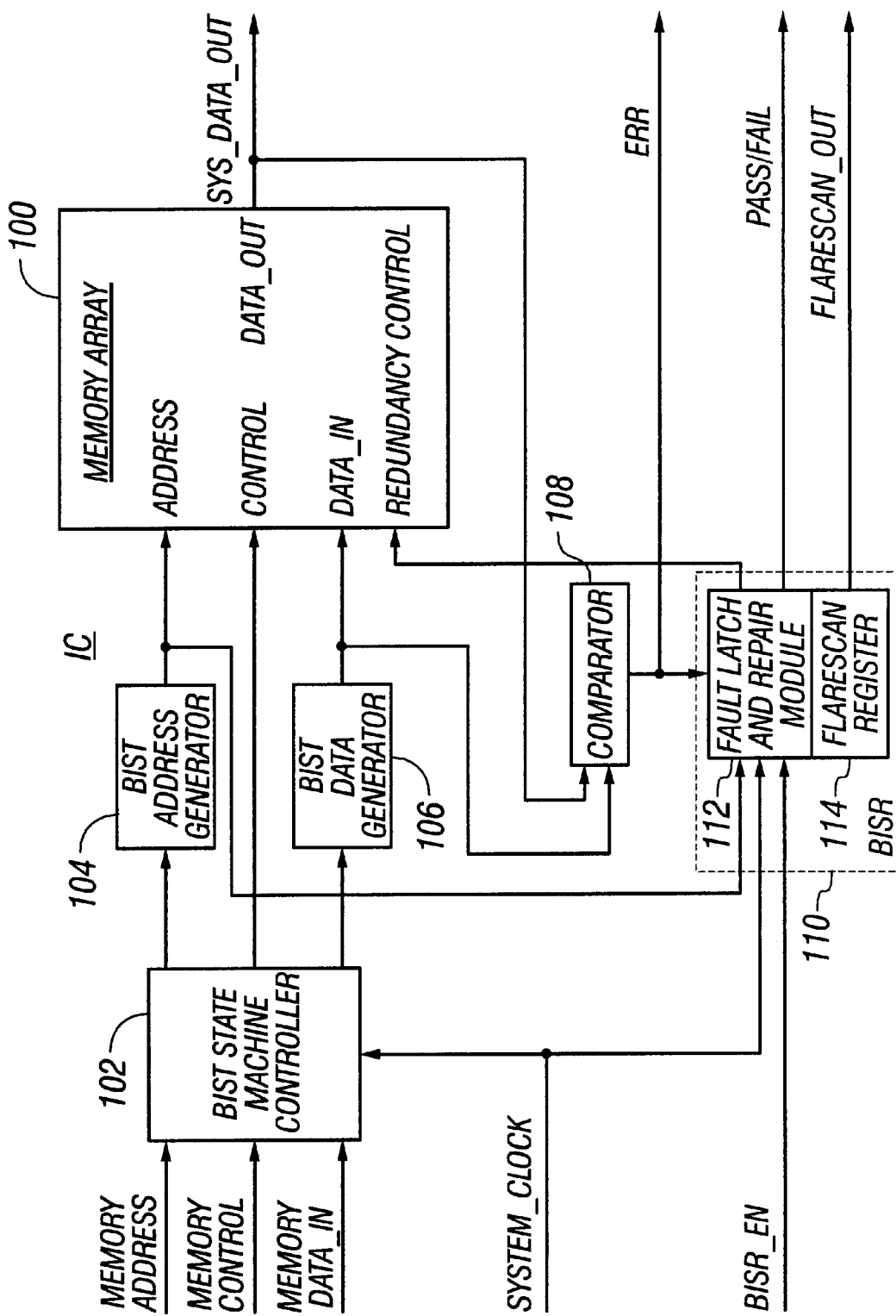
FIG. 1 is a schematic diagram of an integrated circuit incorporating BIST/BISR and identification circuitry capable of being utilized with the present invention.

Turning now to the drawings, FIG. 1 provides a simplified schematic diagram of an exemplary integrated circuit IC incorporating testing capabilities capable of being utilized in conjunction with the present invention. This circuitry is combined with a fuse array/identification circuit 150 as described in greater detail below in conjunction with FIG. 2.

The integrated circuit IC comprises a built-in self-test (BIST) state machine/controller 102 for controlling the various other components of the disclosed memory BIST system, a built-in self repair (BISR) circuit 110, and a memory array 100. In addition to the BIST state machine/controller 102, other components of the BIST circuitry include an address generator 104, a data generator 106 and a comparator 108. The BIST circuitry functions to generate and execute test patterns for detecting column and row faults in the memory array 100. The BISR circuitry 110 is coupled to the memory array 100 to repair detected column and/or row faults by any of a number of techniques, including redirecting the original address locations of faulty memory lines to the mapped address locations of redundancy lines. The BISR circuitry 110 comprises a fault latch and repair module 112 and a FLARESCAN register 114. The memory array 100 may be a dynamic random access memory (DRAM), a static random access memory (SRAM), a read-only memory (ROM), or any other type of circuitry having a structured array(s) of elements conducive to built-in self test and repair.

In the disclosed embodiment of the invention, the BIST state machine/controller 102 includes a test pattern generator to generate test pattern algorithms used to detect various types of memory faults, including column line faults, row faults, and retention faults. The test pattern generator is preferably configured to produce a pattern that provides optimal fault coverage in identifying faulty memory cells of the memory array 100. A memory BIST process for use with the present invention can be implemented in several different ways, including a simple one-pass process that only provides pass/fail information to complex, multi-pass systems with several diagnostic modes.

There are two main types of deterministic memory test pattern algorithms: a "march" test and a "neighbor pattern sensitive" test. Either of these tests (or others) could be utilized in an integrated circuit IC according to the present invention. The march test generally refers to a finite sequence of tests performed on each cell in a memory array 100. All of the cells of the memory array 100 are subjected to the same test, and memory cells are tested in either forward or reverse order. March tests are capable of covering all address faults, stuck-at faults, independent coupling faults, linked coupling faults, transition faults, and transition faults linked with coupling faults. Neighbor pattern sensitive tests involve testing every cell of the memory array 100 in relation to the set of neighboring cells, including a base cell. These tests generally require more time to run than march tests, and are capable of covering active, passive, and static neighborhood pattern sensitive faults. Such faults may include stuck-at faults and all coupling and transition faults between physically adjacent memory cells. Since very little external equipment is necessary to test integrated circuit components covered by BIST circuitry, it is often possible to run these types of tests after the manufacturing process has been completed, allowing end users to periodically test functionality and improve reliability.

On-chip BIST structures such as the BIST state machine/controller 102 typically communicate with external devices via an IEEE 1149.1 compliant interface. When implemented with this interface, IEEE 1149.1 test access port (TAP) and boundary scan structures (not shown) are also present on the integrated circuit IC. When implemented in such a fashion, a simple command sequence initiates BIST operation. After the BIST circuitry has completed its test patterns, the BIST state machine/controller 102 scans the results to off-chip test equipment via the test access port. In the disclosed embodiment of the invention, the BIST "signature" can also be retrieved via an output of the FLARESCAN register 114 as discussed more fully below.

The various outputs of the BIST state machine/controller 102 shown in FIG. 1 provide the logical states and inputs for the memory array 100 during testing, and are provided in a sequence as specified by a test pattern algorithm. More specifically, the BIST state machine/controller 102 provides inputs and control signals to the BIST address generator 104 and the BIST data generator 106. In addition, the control input CONTROL (which may take the form of a write enable input) of the memory array 100 is driven by the BIST state machine controller 102 during memory accesses.

The disclosed embodiment of the BIST state machine/controller 102 receives standard memory address bus signals MEMORY ADDRESS, data bus signals MEMORY DATA_IN and control signals MEMORY CONTROL provided by other components or input pins of the integrated circuit IC. In another contemplated embodiment, these signals are provided to the memory array 100 via separate multiplexing circuitry (not shown).

The standard signals are selectively applied to the memory array 100 based upon the test and/or repair status of the memory array 100. As shown, the DATA_IN inputs of the memory array 100 are driven by outputs of the BIST data generator 106. The outputs of the BIST data generator 106 are determined by BIST state machine controller 102, and may comprise either system data (MEMORY DATA_IN) during normal operation of the integrated circuit IC, or test data during testing procedures.

Similarly, the ADDRESS inputs of the memory array 100 are driven by the output(s) of the BIST address generator 104. The outputs of the BIST address generator 104 thereby control the address inputs of the memory array 100 during execution of a test pattern algorithm. Thus, the BIST address generator 104 and BIST data generator 106 may provide address and data sequences, respectively, to the memory array 100 in an order as specified by a test pattern algorithm. Preferably, such sequences provide a set of data bits in a pattern that maximizes fault coverage for detecting various types of faults within the memory array 100. A system clock signal SYSTEM_CLOCK is also provided to both the BIST state machine controller 102 and the BISR circuitry 110 for logic clocking and synchronization.

During testing, data patterns provided to the memory array 100 by the BIST circuitry are propagated through the memory array 100 to the output bus SYS_DATA_OUT. Under BIST operation, these outputs are routed to the comparator 108, which compares the outputs of the memory array 100 on a read cycle against the corresponding binary bits produced by the BIST data generator 106 on the initiating write cycle. In the disclosed embodiment of the invention, an error signal ERR driven by the output of the comparator 108 is provided to the fault latch and repair module of the BISR circuitry 110. If there is no difference between DATA_IN and DATA_OUT, the error signal ERR is not asserted. If there is a difference, the ERR signal is asserted to indicate that a fault has been detected at that particular memory location.

The error signal ERR is utilized by the BISR circuitry 110 to perform self repair operations on the memory array 100. More specifically, the fault latch and repair module 112 repairs defective memory locations by redirecting accesses to defective address locations to address locations which can retain valid data. To this end, a redundant memory location control signal REDUNDANCY CONTROL is provided from the fault latch and repair module 112 to the memory array 100, and is asserted as necessary to prevent access to faulty memory locations. The fault latch and repair module 112 monitors the output of the BIST address generator 104 as shown to identify pending accesses to defective memory locations. The fault latch and repair module 112 also provides a pass/fail signal PASS/FAIL to other circuitry, which may include external test equipment or the BIST state machine controller 102.

In the disclosed embodiment, the addresses of faulty memory locations are provided from the BISR circuitry 110 to a fault-latching and repair execution, or FLARESCAN, register 114. The contents of the FLARESCAN register 114 can be scanned out to ATE via a register output signal FLARESCAN_OUT. Table 1 is an exemplary bit capture file retrieved from a FLARESCAN register 114 following execution of BIST/BISR procedures, and represents faulty memory locations of different integrated circuits IC of a single wafer (not separately illustrated). Data from subsequent BIST runs can be compared as described below to determine if memory locations fail under different stress factors. Further details of an exemplary comparison process can also be found in commonly-assigned U.S. patent application Ser. No. 09/209,938, now U.S. Pat. No. 6,067,262 entitled "REDUNDANCY ANALYSIS FOR EMBEDDED MEMORIES WITH BUILT-IN SELF TEST AND BUILT-IN SELF REPAIR" which is hereby incorporated for all purposes as if set forth in its entirety.

TABLE 1

FLARESCAN BIT CAPTURE FILE

```
Z733163R.1     WO3      X129    Y131

0000000000000000000000000000000000000000000000
0000000000000000000000000000000000000000000000000000000000000000000000000000
000000000000000000000000000000000000000000000000000000000000
Z733163R.1     WO3      X128    Y131

0000000000000000000000000000000000000000000000
00000000000000000000000000000000000000000000000000000000000000000001111111101010000
000000000000000000000000000000000001111111101110000000000000
Z733163R.1     WO3      X126    Y130

0000000000000000000000000000000000000000000000
000000000000000000000001111111101100000000000000000000000000001111111100100000000000000
000000000001111111100111111111111011111111110111000000000000
```

Figure 2:
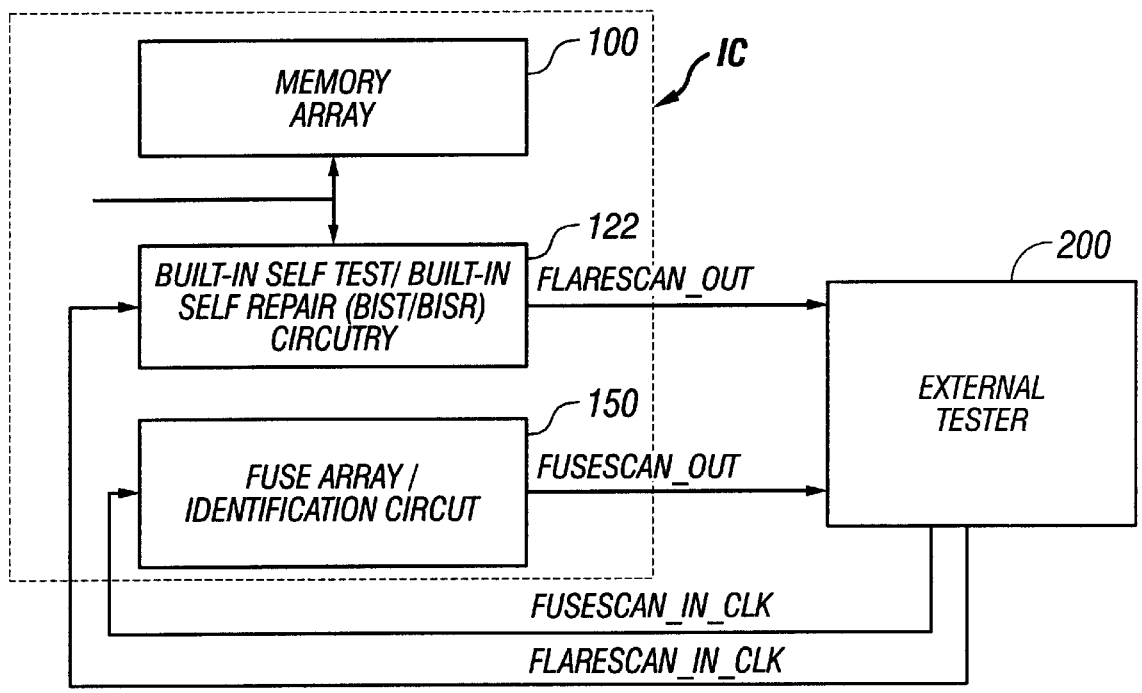
FIG. 2 is a block diagram of an external test system and an integrated circuit die incorporating die testing capabilities according to the present invention.

Referring now to FIG. 2, a simplified diagram is provided for an external tester 200 and an integrated circuit IC incorporating testing capabilities in accordance with the present invention. The integrated circuit incorporates a fuse array/identification circuit 150 which is preferably programmed with an identification number that permits the integrated circuit IC to be distinguished from other integrated circuits of the same wafer lot. As described more fully below in conjunction with FIGS. 3A–3B, the fuse array/identification circuit 150 permits correlation between test results and a specific integrated circuit IC at various stages during the manufacturing process.

In addition, the integrated circuit IC includes BIST/BISR circuitry 122 such as that shown in FIG. 1. The BIST/BISR circuitry 122 interfaces with an embedded memory array 100 as previously described, and also communicates with the external ATE 200 via the register output FLARESCAN_OUT or similar means. The register output signal FLARESCAN_OUT provides the external ATE 200 with addresses of memory locations in the embedded memory array 100 which fail BIST analysis. In the disclosed embodiment of the invention, clocking of the BIST/BISR circuitry 122 is controlled by a clock signal FLARESCAN_IN_CLK from the external ATE 200. Other control signals may also be communicated as necessary from the external ATE 200 to the BIST/BISR circuitry 122.

The illustrated test arrangement is exemplary in nature, and the precise arrangement and electrical couplings between the external ATE 200 and the integrated circuit IC is not considered critical to the invention. Many different signal arrangements could be used to communicate failure information from the integrated IC to the external ATE 200. Further, it is contemplated that a testing procedure according to the disclosed embodiment of the invention could be utilized for electrical components of an integrated circuit IC other than embedded memories.

In accordance with the present invention, a fuse array/identification circuit 150 or other identification means is provided in the integrated circuit IC such that the external ATE 200 may correlate data provided by the BIST/BISR circuitry 122 with a specific integrated circuit IC throughout the manufacturing and testing process. In the disclosed embodiment, identification information is provided from the fuse array/identification circuit 150 to the external ATE 200 via a register output signal FUSESCAN_OUT. This process may be controlled via a separate clock signal FUSESCAN_IN_CLK provided from the external ATE 200 to the fuse array/identification circuit 150. Alternatively, fuse array/identification circuit 150 may utilize other clock signal sources such as the clock signal FLARESCAN_IN_CLK or a clock signal source internal to the integrated circuit IC itself.

The precise structure of the fuse array/identification circuit 150 is not considered critical to the invention, and many different fuse array/identification circuits could be constructed as will be appreciated by those skilled in the art. For example, individual fuse elements according to the invention may be constructed of a variety of materials as will be appreciated by those skilled in the art, including: aluminum, copper, polysilicon, silicide or another high conductive metal or alloy. In a conventional fuse element, two conductive lines are joined by a "neck" portion having a width considerably less than that of the conductive lines. When programming a fuse, this neck region is removed or blown open (i.e., melted away) via a laser beam or similar methodology. A large number of individual fuse elements are placed side-by-side to form a fuse bank.

Figure 3A:
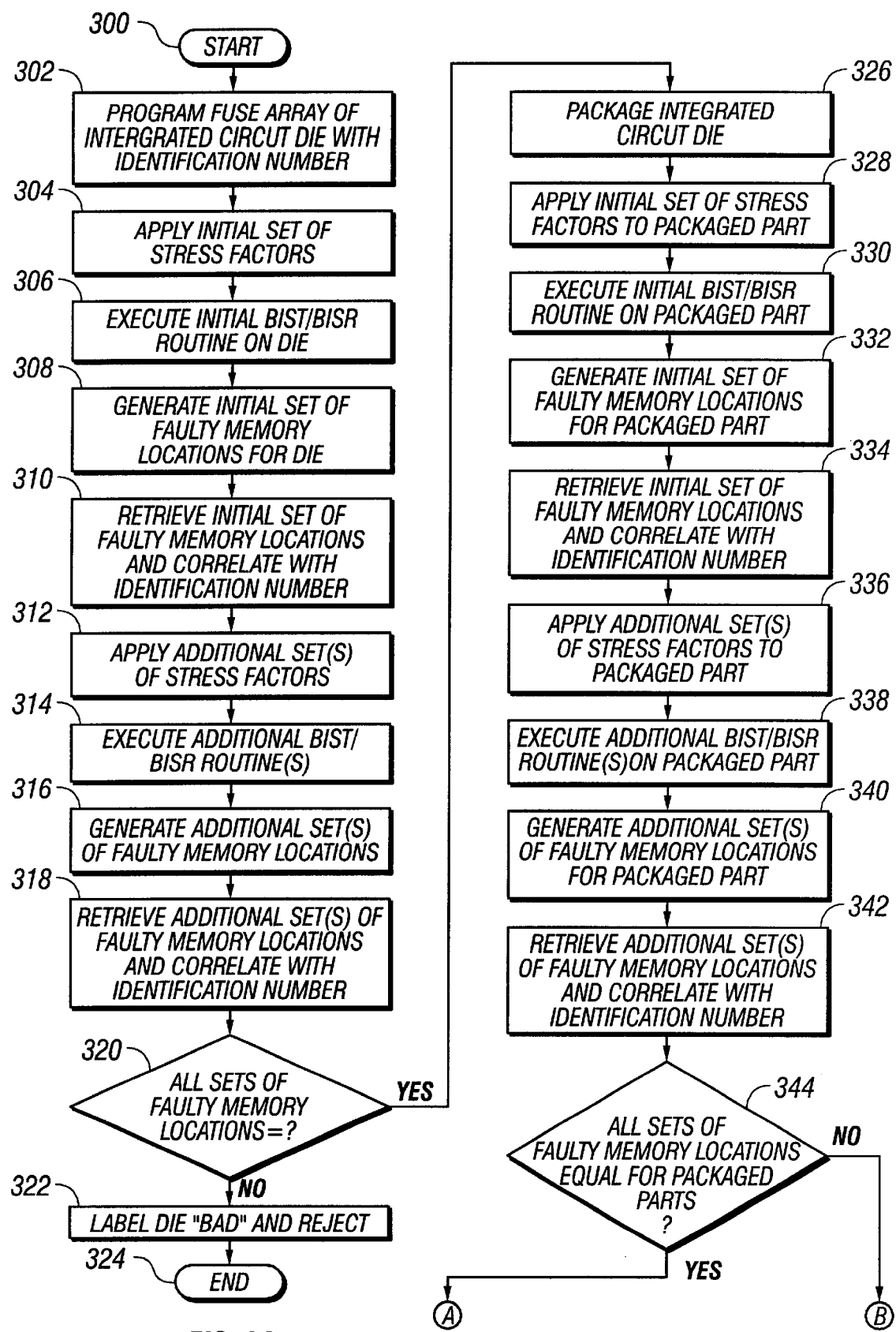
FIGS. 3A, 3B are flowchart illustrations of an exemplary testing procedure in accordance with the present invention.
Figure 3B:
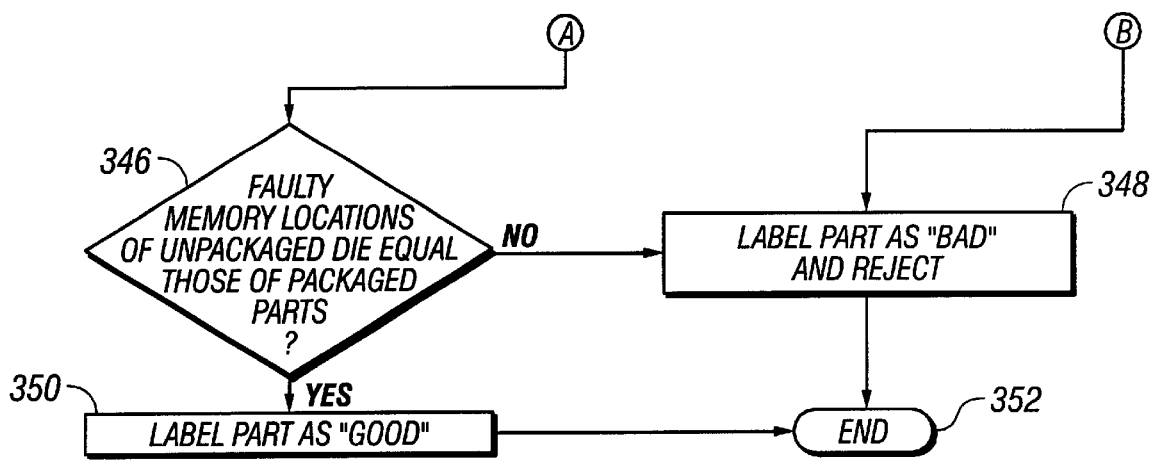

Referring now to FIGS. 3A–3B, flowcharts of an exemplary testing procedure in accordance with the present invention are provided. The testing procedure involves many potential stages, and includes execution of BIST/BISR routines at least one set operating conditions or stress factors prior to singulation of the integrated circuit IC from the semiconductor wafer on which it is manufactured. Additional testing is performed on the integrated circuit IC after it has been subjected to the rigors of the packaging process. Results of the testing at the various stages are correlated via use of the fuse array/identification circuit 150. In general, the assumption is made that an integrated circuit IC that exhibits different failure mechanisms at different stages of the testing/manufacturing process is questionable and the part is discarded.

It should be understood that the term "stress factor" refers to one or more environmental or operating conditions, and may include varying combinations of factors, such as temperature and humidity, temperature and voltage, speed and voltage, etc. For example, temperature and voltage may be applied to the integrated circuit IC under minimum/maximum operating conditions. Typically, a BIST/BISR run is executed when the integrated circuit IC is subjected to minimum temperature and maximum voltage. In addition, a BIST/BISR run is normally executed when the die is subjected to maximum temperature and minimum operating voltage. Consequently, the integrated circuit IC is preferably subjected to a host of stress factors and is tested under various conditions to improve the reliability of parts shipped to end-users.

Beginning with FIG. 3A, the exemplary testing procedure is described in greater detail. Following commencement of the testing procedure for a given integrated circuit IC, or at any other pre-testing stage of the manufacturing process, the fuse array/identification circuit 150 is programmed with identification number that allows the integrated circuit IC to be differentiated from other integrated circuits IC which are also being subjected to the test procedures. Next, in step 304, the integrated circuit IC is exposed to an initial set of one or more stress factors. As an example, the integrated circuit IC may be subjected to a minimum temperature as specified in the data sheet of the device. A predetermined amount of time is allowed to elapse in order for the integrated circuit IC to adjust to the initial set of stress factors. Power is also applied to the integrated circuit IC at this stage. Next, an initial BIST/BISR routine is executed at step 306. In the disclosed embodiment of the invention, diagnosis and repair of the integrated circuit IC by the BIST/BISR circuitry 122 are performed upon initial power-up or when initiated by the external ATE 200.

In conjunction with step 306, an initial set of faulty memory locations for the integrated circuit IC under test is developed in step 308. This initial set of faulty memory locations (e.g., the BIST signature), as well as any other desired information, is then retrieved by the external ATE 200 at step 310. Also at step 310, the initial set of faulty memory locations is correlated with the identification number for the integrated circuit IC under test. It is contemplated that the identification number may be retrieved at this stage or at any other earlier stage of the testing process.

Next, one or more additional sets of stress factors are applied to the integrated circuit IC under test in optional step 312. For example, the integrated circuit IC may be subjected to a maximum specified temperature, or other stress factor such as a supply voltage variation. For each additional set of stress factors, an additional BIST/BISR routine is executed as depicted in step 314 (FIG. 3B). For each such additional BIST/BISR routine, an additional set of memory locations is generated as shown in step 316. The external ATE 200 correlates each of these additional sets of faulty memory locations with the identification number for the integrated circuit under test in step 318.

If more than one set of faulty memory locations as been retrieved by the external ATE 200 for the unpackaged integrated circuit IC under test, the test results are examined in step 320 to determine if all of the sets of faulty memory locations are equal under the different stress factors. If it is indicated in step 320 that a memory location has failed under one BIST/BISR run and not another, then the integrated circuit is labeled as "bad" at step 322 and it is rejected. The test process for the integrated circuit IC under test may then be prematurely halted at step 324. If it is determined in step 320 that any failing memory locations failed under all of the different sets of stress factors, the manufacturing/test procedure continues in step 326.

One skilled in the art will appreciate that the determination of step 320 need not necessarily be performed after all BIST/BISR runs, but could be performed after each additional run. Further, although not explicitly shown, if the results of step 320 indicate that none of the memory address locations failed a BIST/BISR procedure, then the integrated circuit die can be labeled as "prime" (i.e., no redundant memory elements have been required). For those integrated circuits IC having faulty memory locations, subsequent analysis of the "good" die can be made to determine whether the die are repairable or unrepairable based on the number of failed memory locations versus the number of redundant memory elements. If unrepairable, the die can be used for failure analysis for further yield enhancement.

As indicated at step 326, the integrated circuit IC under test is singulated from the other die of the semiconductor wafer and subsequently packaged. One skilled in the art will appreciate that the rigors of the assembly or packaging process may create new failure mechanisms for the singulated integrated circuit IC. It will be also be appreciated that it is not practical to manually serialize integrated circuits for correlation to test results. In addition, the test process may include a step referred to in the art as "burn-in". Burn-in generally refers to the process of exercising an integrated circuit IC at elevated voltage and temperature. This process accelerates failures normally manifested as "infant morality" (the early portion of the bathtub curb at which the failure rates decline with exposure to time) in a semiconductor device.

Following packaging of the integrated circuit die, an initial set of stress factors is applied to the package part in step 328. After an appropriate amount of time, an initial BIST/BISR routine is then executed on the package part in step 330. Next, in step 332, an initial set of faulty memory locations is generated for the package part as a result of step 330. In step 334, the initial set of faulty memory locations for the package part is retrieved by the external ATE 200 and correlated with the identification number for the package part. This identification number corresponds to the identification number programmed in the fuse array/identification circuit 150 as previously described.

The testing procedure continues in optional step 336 where additional sets of optional stress factors may be applied to the package part. An additional BIST/BISR routine is executed for each additional set of stress factors applied to the packaged part as indicated in step 338. For each additional BISR/BIST routine, an additional set(s) of faulty memory locations is generated as shown in step 340. The test procedure then progresses to step 342, where the optional additional sets of faulty memory locations are retrieved and correlated with the identification number of the packaged part. Next, in step 344, the differing sets of faulty memory locations retrieved for the packaged part are analyzed to determine if the failure mechanisms (i.e., faulty memory locations) are consistent. This step may comprise comparison of final test results to burn-in test results, or comparison of different burn-in test results.

If the BIST signatures for the packaged part are equal as determined in step 344, the testing procedure proceeds to step 346 where the results of BIST/BISR runs for the unpackaged integrated circuit IC are compared to the test results of the packaged part. If it is determined in step 346 that any detected faulty memory locations are faulty under all of the various sets of stress factors—both pre- and post-packaging—the test procedure proceeds to step 350 and the packaged part is labeled as a "good" or passing part. If differing fault mechanisms are detected in either of steps 344 or 346, the part is labeled "bad" in rejected in step 348. As noted above, disparities between detected faulty memory locations provide an indication that the integrated circuit IC under test may experience problems in the field. Following either of steps 350 or 348, the testing procedure ends in step 352. As will be appreciated, the comparisons of steps 344 and 346 are facilitated by use of the identification number provided by the fuse array/identification circuit 150.

Thus, a method has been described for improving the fault coverage of manufacturing tests for integrated circuits incorporating structures such as embedded memories. In the disclosed embodiment of the invention, the integrated circuit die of a semiconductor wafer are provided with a fuse array or other circuitry capable of storing an identification number. The fuse array of each integrated circuit die is encoded with an identification number to differentiate the die from other die of the wafer or relevant wafer lot. At each manufacturing test step, which may involve a number of different sets of operating conditions, the fuse identification numbers are read into a test database along with the BIST signature or memory repair solution to facilitate failure analysis. The test results are analyzed to determine if any detected repairable failure mechanisms are uniform across the various stages of the manufacturing process and under a variety of operating conditions. If not, the part is discarded, thereby improving the quality of the end product.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for testing an integrated circuit having an identification circuit and a built-in self test circuit, comprising the steps of:

providing an identification number to the identification circuit, the identification number differentiating the integrated circuit from other integrated circuits;

applying a first stress factor(s) to the integrated circuit;

performing a first built-in self test analysis to detect faults in a predetermined portion of the integrated circuit;

generating first fault information pertaining to any faults detected by the first built-in self test analysis;

correlating the identification number with first fault information;

applying a second stress factor(s) to the integrated circuit;

performing a second built-in self test analysis on the predetermined portion of the integrated circuit;

generating second fault information pertaining to any faults detected by the second built-in self test analysis;

correlating the identification number with second fault information; and comparing the first fault information with the second fault information to ascertain any differences, wherein the comparison step utilizes the identification number.

2. The method of claim 1, further comprising the steps of:

prior to the step of performing the second built-in self test analysis, singulating the integrated circuit; and packaging the integrated circuit to form a packaged part.

3. The method of claim 2, further comprising the step of:

rejecting the integrated circuit if the first fault information does not equal the second fault information.

4. The method of claim 2, wherein the step of correlating the identification number with first fault information comprises retrieving the identification number from bond pads of the integrated circuit, and wherein the step of correlating the identification number with second fault information comprises retrieving the identification number from leads of the packaged part.

5. The method of claim 4, wherein the steps of correlating the identification number with first and second fault information and the step of comparing the first fault information with the second fault information are performed by automated test equipment (ATE).

6. The method of claim 2, wherein the predetermined portion of the integrated circuit comprises an embedded memory.

7. The method of claim 6, wherein the first fault information is a first set of memory address locations and the second fault information is a second set of memory address locations.

8. The method of claim 6, wherein the fault information for the integrated circuit die and the fault information for the packaged part comprise memory address locations.

9. The method of claim 1, wherein the identification circuit is a programmable fuse circuit.

10. The method of claim 1, wherein the first stress factor(s) and the second stress factor(s) comprises differing operating conditions.

11. The method of claim 10, wherein the first stress factor comprises a minimum temperature and second stress factor comprises a maximum temperature.

12. The method of claim 1, wherein the first stress factor is a minimum voltage and the second stress factor is a maximum voltage.

13. A method for testing an integrated circuit die having an identification circuit, a built-in self test circuit, and a built-in self repair circuit, comprising the steps of:

providing an identification number to the identification circuit die, the identification number differentiating the integrated circuit die from other integrated circuit die;

applying at least one set of stress factor(s) to the integrated circuit die;

performing a built-in self test analysis for each set of stress factor(s) to detect faults in the predetermined portion of the integrated circuit die;

generating a set of fault information resulting from each built-in self test analysis executed on the integrated circuit die;

correlating the identification number with each set of fault information for the integrated circuit die;

singulating the integrated circuit die;

packaging the singulated integrated circuit die to form a packaged part;

applying at least one set of stress factor(s) to the packaged part;

performing a built-in self test analysis for each set of stress factor(s) to detect faults in the predetermined portion of the integrated circuit die of the packaged part;

generating a set of fault information resulting from each built-in self test analysis executed on the packed part;

correlating the identification number with each set of fault information for the packaged part; and comparing the fault information for the integrated circuit die with the fault information for the packaged part to ascertain any differences, wherein the comparison utilizes the identification number.

14. The method of claim 13, further comprising the step of:

rejecting the packaged part if the fault information for the integrated circuit die does not equal the fault information for the packaged part.

15. The method of claim 13, further comprising the steps of:

prior to the step of singulating the integrated circuit die, comparing one set of fault information for the integrated circuit die with another set of fault information for the integrated circuit die, wherein the comparison utilizes the identification number; and rejecting the integrated circuit die if the two sets of fault information are not equal.

16. The method of claim 13, further comprising the steps of:

comparing one set of fault information for the packaged part with another set of fault information for the packaged part, wherein the comparison utilizes the identification number; and rejecting the packaged part if the two sets of fault information are not equal.

17. The method of claim 13, wherein the step of correlating the identification number with each set of fault information for the integrated circuit die comprises retrieving the identification number from bond pads of the integrated circuit die, and wherein the step of correlating the identification number with each set of fault information for the packaged part comprises retrieving the identification number from leads of the packaged part.

18. The method of claim 17, wherein the steps of correlating the identification number with the fault information for the integrated circuit die and the packaged part are performed by automated test equipment (ATE).

19. The method of claim 13, wherein the identification circuit is a programmable fuse circuit.

20. The method of claim 13, wherein the predetermined portion of the integrated circuit comprises an embedded memory.

* * * * *